United States Patent
Yao et al.

(10) Patent No.: US 11,448,929 B2
(45) Date of Patent: Sep. 20, 2022

(54) ARRAY SUBSTRATE WITH LIGHT SHIELDING METAL PORTIONS AND MANUFACTURING METHOD THEREOF, DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Lei Yao, Beijing (CN); Dawei Shi, Beijing (CN); Wentao Wang, Beijing (CN); Lu Yang, Beijing (CN); Haifeng Xu, Beijing (CN); Lei Yan, Beijing (CN); Jinfeng Wang, Beijing (CN); Jinjin Xue, Beijing (CN); Fang Yan, Beijing (CN); Xiaowen Si, Beijing (CN); Lin Hou, Beijing (CN); Zhixuan Guo, Beijing (CN); Yuanbo Li, Beijing (CN); Xiaofang Li, Beijing (CN)

(73) Assignees: ORDOS YUANSHENG OPTOELECTRONICS CO., LTD., Inner Mongolia (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 324 days.

(21) Appl. No.: 16/606,895

(22) PCT Filed: May 16, 2019

(86) PCT No.: PCT/CN2019/087251
§ 371 (c)(1),
(2) Date: Oct. 21, 2019

(87) PCT Pub. No.: WO2019/242438
PCT Pub. Date: Dec. 26, 2019

(65) Prior Publication Data
US 2021/0333608 A1    Oct. 28, 2021

(30) Foreign Application Priority Data

Jun. 22, 2018    (CN) .......................... 201810652245.0

(51) Int. Cl.
*H01L 27/14*    (2006.01)
*G02F 1/136*    (2006.01)
(Continued)

(52) U.S. Cl.
CPC ...... *G02F 1/13606* (2021.01); *G02F 1/13629* (2021.01); *G02F 1/13685* (2021.01);
(Continued)

(58) Field of Classification Search
CPC .......... G02F 1/13606; G02F 1/136209; G02F 1/136218; G02F 1/136286; G02F 1/13685; H01L 27/124
See application file for complete search history.

(56) References Cited

U.S. PATENT DOCUMENTS 9,620,536 B2    4/2017    Du et al.
2016/0005769 A1*    1/2016    Uramoto ........... H01L 29/78645
                                                    349/46
(Continued)

FOREIGN PATENT DOCUMENTS

CN    101118915    2/2008
CN    102681274    9/2012
(Continued)

OTHER PUBLICATIONS

Chinese Office Action in corresponding Chinese Application No. 201810652245.0 dated Feb. 25, 2020 (an English translation attached hereto). 24 pages.

*Primary Examiner* — Paisley L Wilson
(74) *Attorney, Agent, or Firm* — Leason Ellis LLP (57) ABSTRACT

An array substrate and a manufacturing method thereof, and a display device are provided. The array substrate includes:
(Continued)

a base substrate; a plurality of gate lines on a side of the base substrate; a plurality of data lines on a side of the plurality of gate lines away from the base substrate and intersecting with the plurality of gate lines; and a plurality of light shielding metal portions between the base substrate and each of the plurality of gate lines; respective one of the gate lines includes a plurality of gate line sub-segments separated by the plurality of data lines, respectively, every two adjacent gate line sub-segments in the respective one of the gate lines correspond to one of the light shielding metal portions, and the every two adjacent gate line sub-segments are connected in series through the one of the light shielding metal portions.

16 Claims, 7 Drawing Sheets

(51) Int. Cl.
 *G02F 1/1362* (2006.01)
 *G02F 1/1368* (2006.01)
 *H01L 27/12* (2006.01)

(52) U.S. Cl.
 CPC .. *G02F 1/136209* (2013.01); *G02F 1/136218* (2021.01); *G02F 1/136295* (2021.01); *H01L 27/124* (2013.01); *H01L 27/1222* (2013.01); *H01L 27/1259* (2013.01)

(56) References Cited

U.S. PATENT DOCUMENTS

| | | | |
|---|---|---|---|
| 2017/0102596 A1* | 4/2017 | Sugimoto | ............ G02F 1/1368 |
| 2018/0341159 A1 | 11/2018 | Gan et al. | |
| 2019/0146293 A1 | 5/2019 | Xue et al. | |

FOREIGN PATENT DOCUMENTS

| | | | | |
|---|---|---|---|---|
| CN | 104538400 | | 4/2015 | |
| CN | 104600030 | | 5/2015 | |
| CN | 104808376 | | 7/2015 | |
| CN | 104808376 A | * | 7/2015 | ......... G02F 1/13338 |
| CN | 106842741 | | 6/2017 | |
| CN | 107797344 | | 3/2018 | |
| CN | 108803170 | | 11/2018 | |
| JP | 2009116060 | | 5/2009 | |
| KR | 20060068442 | | 6/2006 | |

* cited by examiner

FIG. 5C

ARRAY SUBSTRATE WITH LIGHT SHIELDING METAL PORTIONS AND MANUFACTURING METHOD THEREOF, DISPLAY DEVICE

CROSS-REFERENCE TO RELATED PATENT APPLICATIONS

This application is a U.S. National Stage Application under 35 U.S.C. § 371 of International Patent Application No. PCT/CN2019/087251, filed May 16, 2019, which claims priority to Chinese patent application No. 201810652245.0, filed on Jun. 22, 2018, both of which are incorporated by reference in their entireties as part of the present application.

TECHNICAL FIELD

Embodiments of the present disclosure relate to an array substrate and a manufacturing method thereof, and a display device.

BACKGROUND

A general thin film transistor liquid crystal display (abbreviated as TFT-LCD), generally uses a common electrode and a pixel electrode that are oppositely disposed to form a liquid crystal driving electric field, so as to adjust a voltage between the common electrode and the pixel electrode to correspondingly adjust a deflection angle of the liquid crystal, and a storage capacitor formed between the common electrode and the pixel electrode can maintain continuous lighting of a corresponding liquid crystal pixel.

SUMMARY

At least one embodiment of the present disclosure provides an array substrate which includes: a base substrate; a plurality of gate lines, disposed on a side of the base substrate; a plurality of data lines, disposed on a side of the plurality of gate lines away from the base substrate and intersecting with the plurality of gate lines; and a plurality of light shielding metal portions, disposed between the base substrate and each of the plurality of gate lines, respectively, respective one of the gate lines comprises a plurality of gate line sub-segments separated by the plurality of data lines, respectively, every two adjacent gate line sub-segments in the respective one of the gate lines correspond to one of the light shielding metal portions, and the every two adjacent gate line sub-segments in the respective one of the gate lines are connected in series through the one of the light shielding metal portions.

For example, in the array substrate provided by some embodiments of the present disclosure, an orthographic projection of respective one of the gate line sub-segments on the base substrate partially overlaps with an orthographic projection portion of a corresponding light shielding metal portion on the base substrate; and an orthographic projection of respective one of the light shielding metal portions on the base substrate intersects with an orthographic projection of a respective data line used to form corresponding gate line sub-segments by separation on the base substrate.

For example, the array substrate provided by some embodiments of the present disclosure further comprises: a plurality of gate line floating segments, disposed between the base substrate and each of the data lines; a respective gate line floating segment is disposed between the every two adjacent gate line sub-segments in the respective one of the gate lines, and is insulated from corresponding two gate line sub-segments in a same layer as the respective gate line floating segment.

For example, the array substrate provided by some embodiments of the present disclosure further comprises: a plurality of pixel units arranged in an array, respective one of the pixel units comprises a thin film transistor, and the thin film transistor is disposed on the base substrate; a source-drain electrode of the thin film transistor is disposed in a same layer as the plurality of data lines; and gate electrodes of thin film transistors of pixel units in one row correspond to one of the plurality of gate lines.

For example, in the array substrate provided by some embodiments of the present disclosure, the thin film transistor further comprises an active layer between a respective gate line and a respective light shielding metal portion, and insulated from the respective gate line and the respective light shielding metal portion, respectively.

For example, in the array substrate provided by some embodiments of the present disclosure, an orthographic projection of the active layer on the base substrate intersects with an orthographic projection of a respective gate line floating segment on the base substrate.

For example, in the array substrate provided by some embodiments of the present disclosure, the orthographic projection of the active layer on the base substrate partially overlaps with an orthographic projection of a respective data line used to form corresponding gate line sub-segments by separation on the base substrate.

For example, in the array substrate provided by some embodiments of the present disclosure, the active layer is U-shaped, and one branch of the active layer that is U-shaped intersects with the respective gate line floating segment.

For example, in the array substrate provided by some embodiments of the present disclosure, the thin film transistor uses the one of the light shielding metal portions connecting the every two adjacent gate line sub-segments in the respective one of the gate lines as a gate electrode of the thin film transistor.

For example, in the array substrate provided by some embodiments of the present disclosure, another branch of the active layer that is U-shaped intersects with one of the every two adjacent gate line sub-segments in the respective one of the gate lines.

For example, in the array substrate provided by some embodiments of the present disclosure, a gate electrode of the thin film transistor is disposed in a same layer as the plurality of gate lines.

For example, the array substrate provided by some embodiments of the present disclosure further comprises an interlayer insulating layer, disposed between the plurality of gate lines and the plurality of data lines.

For example, the array substrate provided by some embodiments of the present disclosure further comprises: at least one of a gate insulating layer and a buffer layer, and the at least one of the gate insulating layer and the buffer layer is disposed between a respective gate line sub-segment of the gate lines and a corresponding light shielding metal portion.

For example, in the array substrate provided by some embodiments of the present disclosure, a material for manufacturing the plurality of light shielding metal portions is same as a material for manufacturing the plurality of gate lines.

At least one embodiment of the present disclosure provides a manufacturing method of an array substrate, manufacturing method comprises: providing a base substrate, and forming a plurality of light shielding metal portions on a side of the base substrate; forming a plurality of gate lines on a side of the plurality of light shielding metal portions away from the base substrate, respective one of the gate lines comprises a plurality of gate line sub-segments, every two adjacent gate line sub-segments in the respective one of the gate lines correspond to one of the light shielding metal portions, and the every two adjacent gate line sub-segments in the respective one of the gate lines are connected in series through the one of the light shielding metal portions; forming a plurality of data lines on a side of the plurality of gate line away from the plurality of light shielding metal portions, wherein the every two adjacent gate line sub-segments are located at two sides of a respective data line, respectively.

For example, in the manufacturing method of the array substrate provided by some embodiments of the present disclosure, the forming the plurality of gate lines on a side of the plurality of light shielding metal portions away from the base substrate, comprises: forming a buffer layer and a gate insulating layer sequentially on surfaces of the plurality of light shielding metal portions away from the base substrate, and forming a plurality of via holes in the buffer layer and the gate insulating layer by a patterning process; and forming the plurality of gate lines on a surface of the gate insulating layer away from the plurality of light shielding metal portions, gate line sub-segments in the respective one of the gate lines are connected in series with corresponding light shielding metal portions through the via holes, respectively.

For example, in the manufacturing method of the array substrate provided by some embodiments of the present disclosure, the forming the plurality of data lines on a side of the plurality of gate line away from the plurality of light shielding metal portions, comprises: forming an interlayer insulating layer on surfaces of the plurality of gate lines away from the plurality of light shielding metal portions; and forming the plurality of data lines on a surface of the interlayer insulating layer away from the plurality of gate lines.

At least one embodiment of the present disclosure provides a display device, which comprises the array substrate according to any one of the embodiments of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

REFERENCE NUMERALS

1—base substrate; 2—light shielding metal portion; 3—buffer layer; 4—active layer; 5—gate insulating layer; 50—via hole; 61—gate line; 611—first gate line sub-segment; 612—second gate line sub-segment; 613—gate line floating segment; 62—gate electrode; 7—interlayer insulating layer; 81—data line; 82—source-drain electrode; 9—planarization layer; 10—common electrode layer; 11—passivation layer; 12—pixel electrode layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following descriptions of the embodiments of the present disclosure clear and concise, detailed descriptions of known functions and known components may be omitted. When any one component described in an embodiment of the present disclosure appears in more than one of the accompanying drawings, the component is represented by a same or similar reference numeral in each of the drawings.

A liquid crystal display device controls a voltage between a common electrode and a pixel electrode by a pixel driving circuit connected to the pixel electrode. The pixel driving circuit generally includes a thin film transistor (TFT), and a gate line and a data line that are connected to the TFT, correspondingly. Because the gate line and the data line intersect with each other, a parasitic capacitance is easily generated in a corresponding liquid crystal pixel, which causes interferences, such as data signal delay or noise signal, etc., to the normal display of the liquid crystal pixel, thereby resulting in poor display quality of the display device.

For an array substrate of a low temperature poly-silicon (LTPS) liquid crystal display (LCD) device, if thin film transistors in liquid crystal pixel units of the array substrate adopt bottom-gate structures, it is easy to ensure a long distance between the gate line and the data line, so that a small parasitic capacitance is formed between the gate line and the data line, but it is also easy to increase mask processes when performing an N+ doping process and a lightly doped drain (LDD) process on the active layers of the thin film transistors, so that the manufacturing process of the LTPS LCD array substrate is complicated and difficult to implement. Therefore, thin film transistors having top-gate structures are generally adopted in a common LTPS LCD array substrate.

Figure 1A:
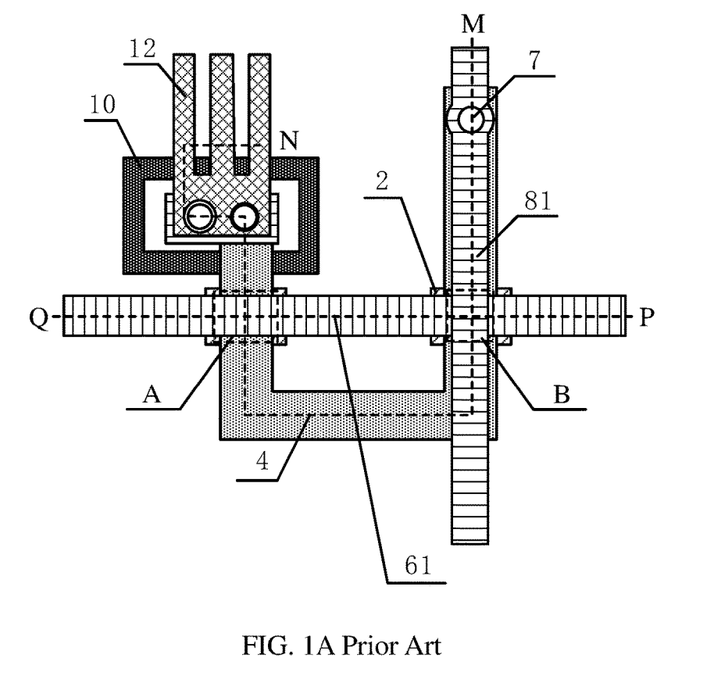
FIG. 1A is a schematic plan view of an array substrate.
Figure 1B:
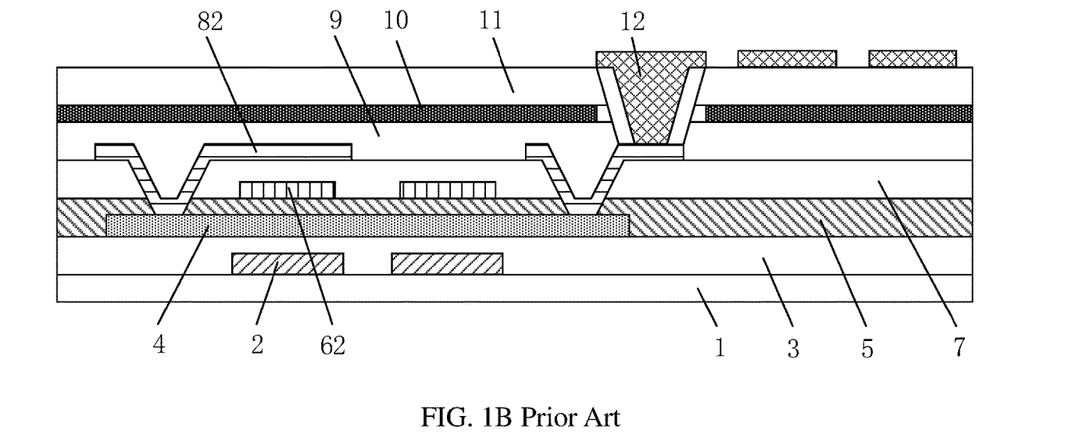
FIG. 1B is a schematic cross-sectional view of the array substrate shown in FIG. 1A taken along line MN.
Figure 1C:
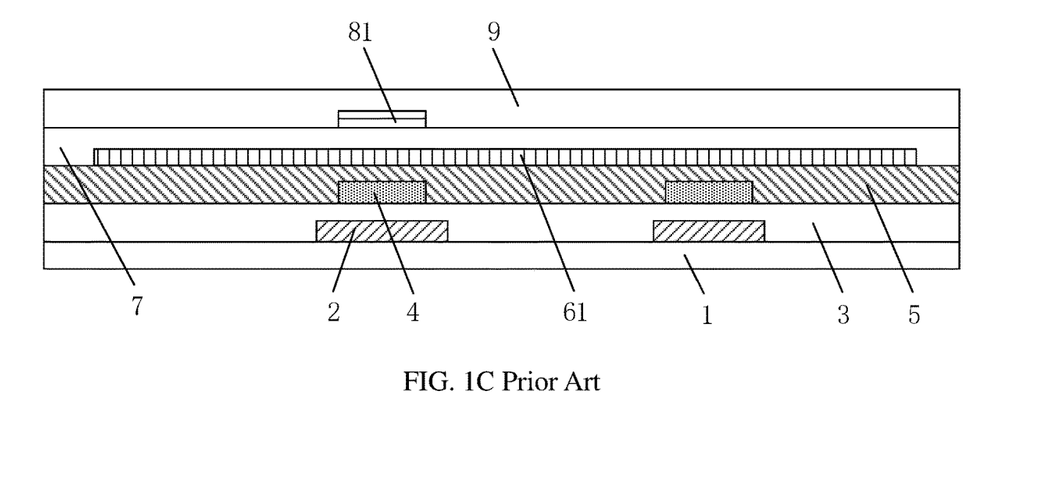
FIG. 1C is a schematic cross-sectional view of the array substrate shown in FIG. 1A taken along line PQ.

FIG. 1A is a schematic plan view of an array substrate, FIG. 1B is a schematic cross-sectional view of the array substrate shown in FIG. 1A taken along line MN, and FIG. 1C is a schematic cross-sectional view of the array substrate shown in FIG. 1A taken along line PQ. For example, the array substrate shown in FIG. 1A may be a LTPS LCD array substrate of thin film transistors having top-gate structures.

As shown in FIG. 1A to FIG. 1C, the array substrate includes a base substrate 1, a light shielding metal portion 2 on a side of the base substrate 1, a buffer layer 3 covering the light shielding metal portion 2, an active layer 4 on a side of the buffer layer 3 away from the light shielding metal portion 2, a gate insulating layer 5 covering the active layer 4, a gate line 61 on a side of the gate insulating layer 5 away from the active layer 4, an interlayer insulating layer 7 covering the gate line 61, a data line 81 on a side of the interlayer insulating layer 7 away from the gate line 61, a planarization layer 9 covering the data line 81, a common electrode layer 10 on a side of the planarization layer 9 away from the interlayer insulating layer 7, a passivation layer 11 and a pixel electrode layer 12 that are both on a side of the common electrode 10 away from the planarization layer 9. In order to clearly illustrate structures such as the active layer 4, the gate line 61, data line 81, and so on, structures such as the base substrate 1, the buffer layer 3, the gate insulating layer 5 and so on are not shown in FIG. 1A. For clarity and conciseness, structures such as the common electrode layer 10, the passivation layer 11 and the pixel electrode layer 12, etc., that are on the planarization layer 9 are not shown in FIG. 1C.

As shown in FIG. 1A to FIG. 1C, in the array substrate, a gate electrode 62 of a thin film transistor may be formed in the same layer as the gate line 61. For example, the gate electrode 62 can be formed by using a portion of the gate line 61 located in an intersection region of the gate line 61 and the active layer 4. For example, intersection regions of the gate line 61 and the active layer 4 are shown by the dashed frames A and B in FIG. 1A. It should be noted that the intersection regions of the gate line 61 and the active layer 4 in FIG. 1A are exemplary. For example, there may be only one intersection region of the gate line 61 and the active layer 4, and the present disclosure is not limited in this aspect. For example, a portion of the gate line in at least one of the intersection regions A and B may be used as the gate electrode, and accordingly, a portion of the active layer 4 corresponding to the gate electrode may not be doped. For example, the gate electrode 62 may also be formed by using a portion branched from the gate line 61, and the present disclosure is not limited in this aspect.

Similarly, in the array substrate, a source-drain electrode 82 of the thin film transistor may be formed in the same layer as the data line 81. For example, in order to increase the aperture ratio of the array substrate, an orthographic projection of the data line 81 on the base substrate 1 at least partially overlaps with an orthographic projection of the active layer 4 on the base substrate 1, so that the source-drain electrode 82 can be formed by using a portion of the data line 61. Besides, the source-drain electrode 82 may also be formed by using a portion branched from the data line 81. Of course, the source-drain electrode 82 may also be formed separately from the data line 81 and then electrically connected to the data line 81, the present disclosure is not limited in this aspect.

As shown in FIG. 1A and FIG. 1B, because the gate line and the data line intersect with each other (referring to the dashed frame B in FIG. 1A), a parasitic capacitance is easily generated between the gate line and the data line (referring to reference numerals 62 and 82 in FIG. 1B and referring to FIG. 1C); further, only the interlayer insulating layer 7 is provided between the gate line and the data line, so that a large parasitic capacitance is easily generated between the gate line and the data line. In order to effectively reduce the parasitic capacitance generated by the gate line and the data line in the array substrate, according to the calculation formula of the parasitic capacitance: $C=\varepsilon S/4\pi kd$, the parasitic capacitance is usually proportional to an area of a facing region between two electrode plates, and is inversely proportional to a distance between the two electrode plates. The gate line and the data line in the array substrate serve as the two electrode plates of the parasitic capacitance, respectively, and the parasitic capacitance generated by the gate line and the data line can be effectively reduced by reducing the area of the facing region between the gate line and the data line or increasing the distance between the gate line and the data line.

In research, the inventors of the present application have observed: if the distance between the gate line and the data line is increased by increasing the thickness of the interlayer insulating layer 7, the problem of color shift at a large viewing angle of the array substrate is easily caused, and the display quality of the display device including the array substrate is reduced; and if the area of the facing region between the gate line and the data line is reduced by reducing a line width of the gate line or a line width of the data line, the process limit is apt to occur, and it is difficult to meet stability requirements of mass production processes.

At least one embodiment of the present disclosure provides an array substrate and a manufacturing method thereof, and a display device. The array substrate includes: a base substrate; a plurality of gate lines, disposed on a side of the base substrate; a plurality of data lines, disposed on a side of the plurality of gate lines away from the base substrate and intersecting with the plurality of gate lines; and a plurality of light shielding metal portions, disposed between the base substrate and each of the plurality of gate lines. Respective one of the gate lines includes a plurality of gate line sub-segments separated by the plurality of data lines, respectively, every two adjacent gate line sub-segments in the respective one of the gate lines correspond to one of the light shielding metal portions, and the every two adjacent gate line sub-segments in the respective one of the gate lines are connected in series through the one of the light shielding metal portions.

In the array substrate provided by the embodiments of the present disclosure, respective one of the gate lines is divided into a plurality of gate line sub-segments separated by the data lines according to relative positions between the gate lines and the data lines, every two adjacent gate line sub-segments of the respective one of the gate lines are connected in series through a respective light shielding metal portion disposed correspondingly on a side of the respective one of the gate lines away from the data lines, so that the respective light shielding metal portion can serve as a part of the respective one of the gate lines, and the distance between the respective one of the gate lines and the data lines in the facing region of the respective one of the gate lines and the data lines can be effectively increased. Therefore, parasitic capacitances formed between the respective one of the gate lines and the data lines are reduced, so as to avoid the interference of the parasitic capacitances to the normal display of the display device including the array substrate, which is conducive to improve the display quality of the display device.

The array substrate and the manufacturing method thereof, and the display device provided by some embodiments of the present disclosure and examples thereof are described in detail below with reference to the accompanying drawings.

Figure 2A:
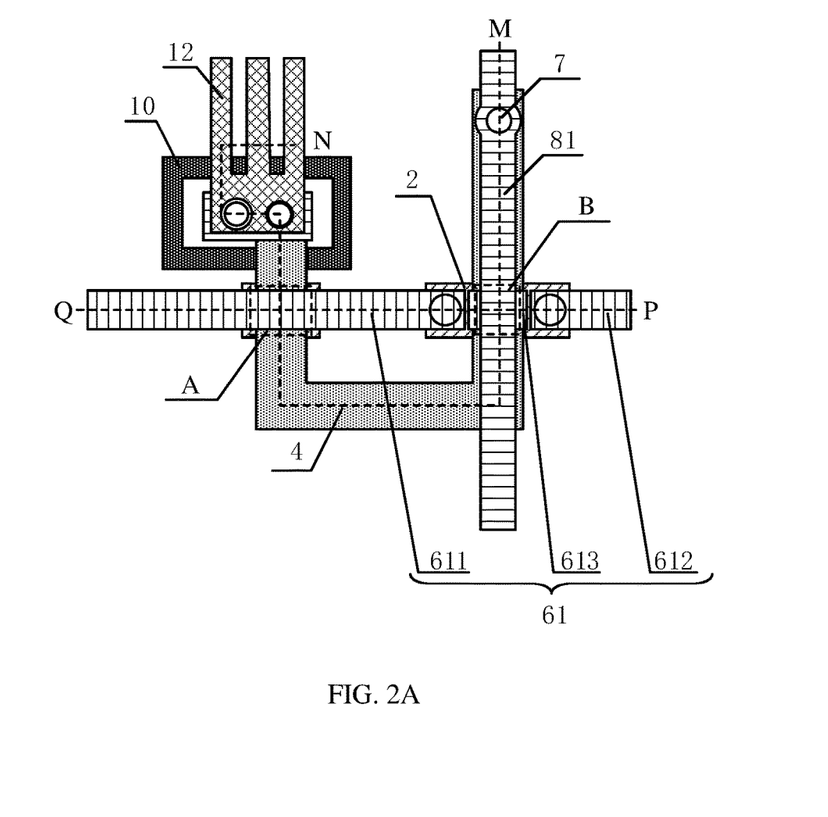
FIG. 2A is a schematic plan view of an array substrate provided by at least one embodiment of the present disclosure.

At least one embodiment of the present disclosure provides an array substrate. FIG. 2A is a schematic plan view of an array substrate provided by at least one embodiment of the present disclosure, FIG. 2B is a schematic cross-sectional view of the array substrate shown in FIG. 2A taken along line MN, and FIG. 2C is a schematic cross-sectional view of the array substrate shown in FIG. 2A taken along line PQ.

Figure 2B:
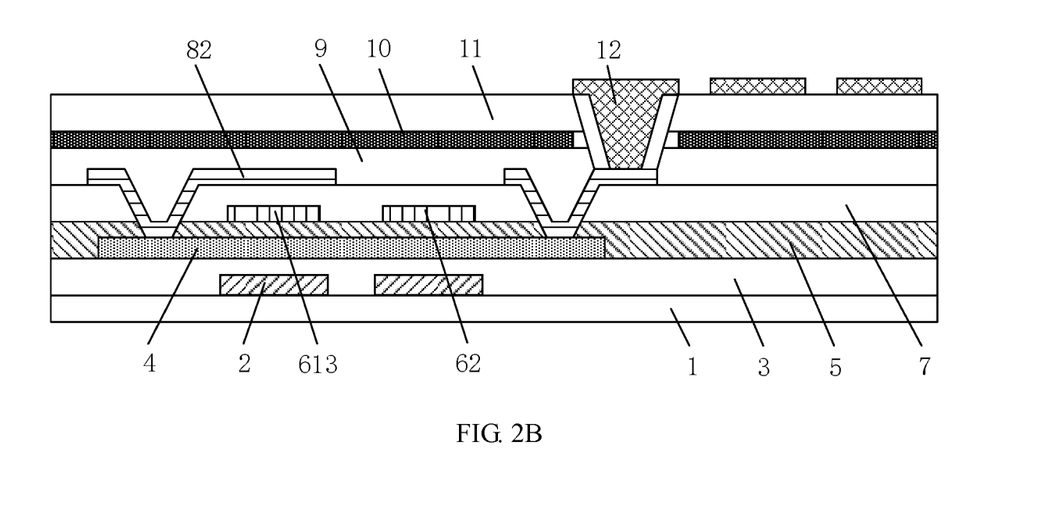
FIG. 2B is a schematic cross-sectional view of the array substrate shown in FIG. 2A taken along line MN.
Figure 2C:
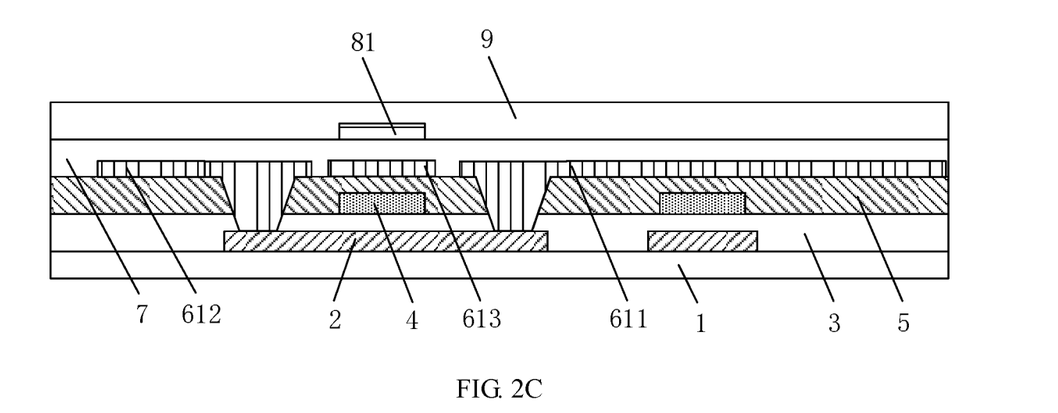
FIG. 2C is a schematic cross-sectional view of the array substrate shown in FIG. 2A taken along line PQ.

As shown in FIG. 2A to FIG. 2C, the array substrate includes a base substrate 1, a plurality of gate lines 61, a plurality of data lines 81, and a plurality of light shielding metal portions 2. The plurality of gate lines 61 are disposed on a side of the base substrate 1; the plurality of data lines 81 are disposed on a side of the plurality of gate lines 61 away from the base substrate 1, and the plurality of data lines 81 and the plurality of gate lines 61 intersect with each other; the plurality of light shielding metal portions 2 are disposed between each of the gate lines 61 and the base substrate 1. Respective one of the gate lines 61 includes a plurality of gate line sub-segments separated by each of the data lines 81, every two adjacent gate line sub-segments in the respective one of the gate lines 61 correspond to one of the light shielding metal portions 2, and the every two adjacent gate line sub-segments in the respective one of the gate lines 61 are connected in series through the one of the light shielding metal portions 2.

For example, in some examples, the gate lines 61 are generally disposed in a different layer from the data lines 81, and the gate lines 61 intersect with the data lines 81 in a grid shape. For example, the gate lines 61 are arranged in rows, and the data lines 81 are arranged in columns. Respective one of the gate lines 61 may be divided into a plurality of gate line sub-segments according to distribution positions of the data lines 81, and the structure of every two adjacent gate line sub-segments can be referred to the structure of a first gate line sub-segment 611 and a second gate line sub-segment 612 shown in FIG. 2A and FIG. 2C. The first gate line sub-segment 611 and the second gate line sub-segment 612 are respectively located on two sides of a corresponding data line 81, that is, orthographic projections of the first gate line sub-segment 611 and the second gate line sub-segment 612 on the base substrate 1 are not covered by an orthographic projection of the corresponding data line 81 on the base substrate 1, and neither the first gate line sub-segment 611 nor the second gate line sub-segment 612 has an region directly facing the corresponding data line 81.

For example, in some examples, a material for manufacturing the light shielding metal portions 2 is generally the same as a material for manufacturing the gate lines 61, for example, the material includes but is not limited to molybdenum (Mo) metal, titanium (Ti) metal, molybdenum alloy, titanium alloy, etc., so that each of the gate lines 61 can have the same conductivity as the corresponding light-shielding metal portions 2. Therefore, in a case where every two adjacent gate line sub-segments in the gate line 61 are connected in series through the corresponding light shielding metal portion 2, the problem of a large load generated between each gate line sub-segment and the corresponding light shielding metal portion 2, due to a large contact resistance between each gate line sub-segment and the corresponding light shielding metal portion 2, can be avoided.

In the array substrate provided by the embodiments of the present disclosure, respective one of the gate lines 61 is divided into a plurality of gate line sub-segments separated by each of the data lines 81 according to the relative positions between the gate lines 61 and the data lines 81, every two adjacent gate line sub-segments are connected in series through one of the light shielding metal portions 2 disposed correspondingly on a side of the respective one of the gate lines 61 away from the data lines 81, so that the one of the light shielding metal portions 2 can serve as a part of the respective one of the gate lines 61, and the distance between the gate line 61 and the data line 81 in the facing region of the gate line 61 and the data line 81 can be effectively increased. Therefore, the parasitic capacitance formed between the gate line 61 and the data line 81 is reduced, so as to avoid the interference of the parasitic capacitance to the normal display of the display device including the array substrate, which is conducive to improve the display quality of the display device.

As can be understood, every two adjacent gate line sub-segments in the respective one of the gate lines corresponding to one of the light shielding metal portions 2 is generally presented as that: an orthographic projection of respective one of the gate line sub-segments on the base substrate partially overlaps with an orthographic projection of a corresponding light shielding metal portion 2 on the base substrate 1. That is, in the process of forming the gate line sub-segments, by disposing a via hole in an overlapping region of the respective one of the gate line sub-segments and the corresponding light shielding metal portion 2, the respective one of the gate line sub-segments can be connected to the corresponding light shielding metal portion 2 through the via hole.

For example, in some examples, referring to FIG. 2A to FIG. 2C, the every two adjacent gate line sub-segments being connected in series through the one of the light shielding metal portions 2 is generally presented as that: an extending direction of the one of the light shielding metal portions 2 configured to connect the two adjacent gate line sub-segments is the same as an extending direction of the gate line 61 including the two adjacent gate line sub-segments. This means that an orthographic projection of the one of the light shielding metal portions 2 on the base substrate 1 intersects with an orthographic projection of a respective data line 81 used to from corresponding gate line sub-segments by separation on the base substrate 1, that is, the one of the light shielding metal portions 2 is disposed to intersect with the respective data line 81.

For example, in some examples, referring to FIG. 2A to FIG. 2C, for convenience of manufacturing, in the array substrate provided in the above embodiments, a plurality of gate line floating segments 613 are disposed between each of the data lines 81 and the base substrate 1; a respective gate line floating segment 613 is disposed between the every two gate line sub-segments, and is insulated from the corresponding two adjacent gate line sub-segments in the same layer as the respective gate line floating segment. That is, when patterning a metal layer for forming the gate lines, that is, forming each of the gate lines 61 arranged in rows, portions of each of the gate lines 61 facing each of the data lines can be directly separated, so that the portions of each of the gate line 61 facing each of the data lines 81 can serve as the gate line floating segments 613, and in this case, adjacent portions on both sides of a respective gate line floating segment 613 along the extending direction of the respective gate line are the first gate line sub-segment 611 and the second gate line sub-segment 612, respectively.

The above-mentioned gate line floating segment 613 is insulated from the adjacent first gate line sub-segment 611 and the adjacent second gate line sub-segment 612. The gate line floating segment 613 is in a floating state, that is, the gate line floating segment 613 is not used for electrical signal transmission and there is no electrical signal transmission in the gate line floating segment 613, so that the gate line floating segment 613 can play a certain shielding role between a corresponding data line 81 and a corresponding light shielding metal 2 (the light shielding metal portion 2 serves as a part of the corresponding gate line 61), thereby further reducing the parasitic capacitance formed between the gate line 61 and the data line 81. In addition, the gate floating segment 613 can also be used to perform alignment shielding for the active layer 4 (for example, specifically, the active layer in the region shown by the dashed frame B in FIG. 2A) disposed between the gate line 61 and the base substrate 1 in a subsequent doping process, such as an N-type heavy doping process or a lightly doped drain (LDD) process or the like of the active layer 4. In this case, the light shielding metal portion 2 corresponding to the region B can also be used as a gate electrode of the thin film transistor.

For example, in some examples, referring to FIG. 2A to FIG. 2C, if a certain gate line sub-segment of the gate line 61 covers exactly a part of the active layer 4 (referring to the dashed frame A in FIG. 2A), the portion of the gate line sub-segment located in the corresponding region A can be used as another gate electrode of the thin film transistor (as shown by 62 in FIG. 2B), and the another gate 62 can also be used to perform alignment shielding for the active layer 4 in the region A in the subsequent doping process. In this case, for example, a thin film transistor having double gate electrodes (a top gate electrode in region A and a bottom gate electrode in region B) can be formed. The portion of the gate line sub-segment located in the corresponding region A may also be removed in the process of forming the gate line 61, so as to expose the active layer 4 to be doped in the region A and facilitate to perform the doping process. For example, in some other examples, portions of the gate line sub-segment located in the region A and on both sides of the region A may be separated into a structure similar to a structure of the gate line floating segment 613, the first gate line sub-segment 611 and the second gate line sub-segment 612. In this case, a portion of the gate line sub-segment corresponding to the first gate line sub-segment 611 and a portion of the gate line sub-segment corresponding to the second gate line sub-segment 612 may also be connected in series through a light shielding metal portion corresponding to the region A. For example, reference may be made to the connection manner in which the first gate line sub-segment 611 and the second gate line sub-segment 612 are connected in series through the light shielding metal portion 2 in the above embodiments, and details are not described here again. In this case, for example, a thin film transistor having double gate electrodes (bottom gate electrodes in both regions A and B) can also be formed. For example, in still other examples, the portion of the gate line sub-segment located in the region A may be removed, and in this case, the portions of the gate line sub-segment located on both sides of the region A may be connected in series through the light shielding metal portion corresponding to the region A. In this case, the active layer corresponding to the region A can be subjected to a subsequent doping process, so that the light shielding metal portion in the region A only functions for the connection in series, and thus a thin film transistor having a single gate electrode (a bottom gate electrode in the region B) can be formed. The embodiments of the present disclosure include, but are not limited to, the above cases.

It can be understood that, referring to FIG. 2A to FIG. 2C, for the array substrate provided by the present embodiment, a plurality of pixel units (not shown in the figures) arranged in an array are generally disposed on the base substrate 1, and each pixel unit includes a thin film transistor which is disposed on the array substrate. The arrangement manners of functional film layers of the array substrate on the base substrate 1 are usually related to the structure of the thin film transistor. An interlayer insulating layer 7 is usually disposed between the gate lines 61 and the data lines 81 for insulating the gate lines 61 from the data lines 81. A gate insulating layer 5 and/or a buffer layer 3 are/is usually disposed between each of the gate line sub-segments of the gate lines 61 and the corresponding light shielding metal portion 2.

For example, referring to FIG. 2B, in the array substrate provided by some examples, the light shielding metal portion 2, the buffer layer 3, the active layer 4, the gate insulating layer 5, and the gate electrode 62 are sequentially formed on a surface of the base substrate 1 from bottom to top. The gate electrode 62 may be disposed in a same layer as the gate line. The interlayer insulating layer 7 and the source-drain electrode 82 are sequentially formed on surfaces of the gate electrode 62 and the gate line away from the gate insulating layer 5, and on a surface of the gate insulating layer 5 not covered by the gate electrode 62 and the gate line. The source-drain electrode 82 may be disposed in a same layer as the data line. A planarization layer 9, a common electrode layer 10, a passivation layer 11, and a pixel electrode layer 12 are sequentially formed on surfaces of the source-drain electrode 82 and the data line away from the interlayer insulating layer 7, and on a surface of the interlayer insulating layer 7 not covered by the source-drain electrode 82 and the data line. It should be noted that in order to clearly illustrate the structures such as the light shielding metal portion 2, the active layer 4, the gate line 61, the data line 81, etc., the structures of the base substrate 1, the buffer layer 3, the gate insulating layer 5, etc., are not shown in FIG. 2A. For clarity and conciseness, the structures such as the common electrode layer 10, the passivation layer 11 and the pixel electrode layer 12, etc., that are on the planarization layer 9 are not shown in FIG. 2C.

It should be noted that, in some examples, the gate electrode 62 of the thin film transistor being disposed in the same layer as the gate line may be that: the gate electrode 62 is formed by a portion of the gate line in an intersection region of the gate line and the active layer 4; or, the gate electrode 62 is formed by using a portion branched from the gate line; or, the gate electrode 62 is formed separately from the gate line and then is electrically connected to the gate line. The embodiments of the present disclosure are not limited thereto.

For example, in some examples, the source-drain electrode 82 of the thin film transistor being disposed in the same layer as the data line may be that: the source-drain electrode 82 (e.g., one of the source electrode and the drain electrode) is formed by using a portion of the data line; or, the source-drain electrode 82 is formed by using a portion branched from the data line; or, the source-drain electrode 82 is formed separately from the data line and then is electrically connected to the data line. The embodiments of the present disclosure are not limited thereto.

For example, in some examples, referring to FIG. 2A to FIG. 2C, the active layer 4 of the thin film transistor is disposed between the gate line 61 and the light shielding metal portion 2, and is insulated from the gate line 61 and the light shielding metal portion 2, respectively. For example, referring to FIG. 2A, the active layer 4 may be U-shaped; An orthographic projection of the data line 81 on the base substrate 1 may partially overlap with an orthographic projection of the active layer 4 on the base substrate 1, so that the aperture ratio can be improved. For example, the orthographic projection of the active layer 4 on the base substrate 1 may also intersect with an orthographic projection of the gate line floating segment 613 on the base substrate. For example, one branch of the U-shaped active layer 4 intersects with the gate line floating segment 613, for example, the intersection region is shown by the dashed frame B in FIG. 2A, so that the gate line floating segment 613 can also perform alignment shielding for the active layer 4 in the region B in a subsequent doping process. For example, the thin film transistor may use the light shielding metal portion 2 that connects the first gate line sub-segment 611 and the second gate line sub-segment 612 in series as a gate electrode (this gate electrode is not disposed in the same layer as the gate line).

For example, referring to FIG. 2A, the other branch of the U-shaped active layer may intersect with one of the adjacent first gate line sub-segment 611 and the adjacent second gate line sub-segment 612 in the respective one of the gate lines 61, or may not intersect with each of the adjacent first gate line sub-segment 611 and the adjacent second gate line sub-segment 612, the embodiments of the present disclosure are not limited in this aspect. For example, referring to FIG. 2A, the other branch of the U-shaped active layer intersects with the first gate line sub-segment 611, for example, the intersection region is shown by the dashed frame A in FIG. 2A. In this case, a portion of the gate line in the region A can also be used as the gate electrode 62 (this gate electrode is disposed in the same layer as the gate line), or another gate electrode may be disposed (for example, this gate electrode is disposed in the same layer as the gate line), the embodiments of the present disclosure are not limited in this aspect. No matter which of the above manners is used for setting the gate electrode of the thin film transistor, the gate electrodes 62 of the thin film transistors of pixel units in one row correspond to one gate line.

It should be noted that the active layer 4 may also be presented in other shapes, such as L-shape, etc., the embodiments of the present disclosure are not limited in this aspect.

It should be noted that, in some examples, the thin film transistor may include one gate electrode 62 without using the light shielding metal portion 2 that connects the first gate line sub-segment 611 and the second gate line sub-segment 612 in series as the gate electrode. In this case, before forming the gate line floating segment 613, a doping process may be performed on the active layer 4 in the region B, so that the light shielding metal portion 2 can transmit signals in the gate line.

In the array substrate provided by the embodiments of the present disclosure, a respective gate line is divided into a plurality of gate line sub-segments separated by each of the data lines according to the relative positions between the gate lines and the data lines, every two adjacent gate line sub-segments are connected in series through a respective light shielding metal portion disposed correspondingly on a side of the respective gate line away from the data lines, so that the respective light shielding metal portion can serve as a part of the respective gate line, and the distance between the gate line and the data line in a facing region of the gate line and the data line can be effectively increased. Therefore, the parasitic capacitance formed between the gate line and the data line is reduced, so as to avoid the interference of the parasitic capacitance to the normal display of the display device including the array substrate, which is conducive to improve the display quality of the display device.

Figure 3:
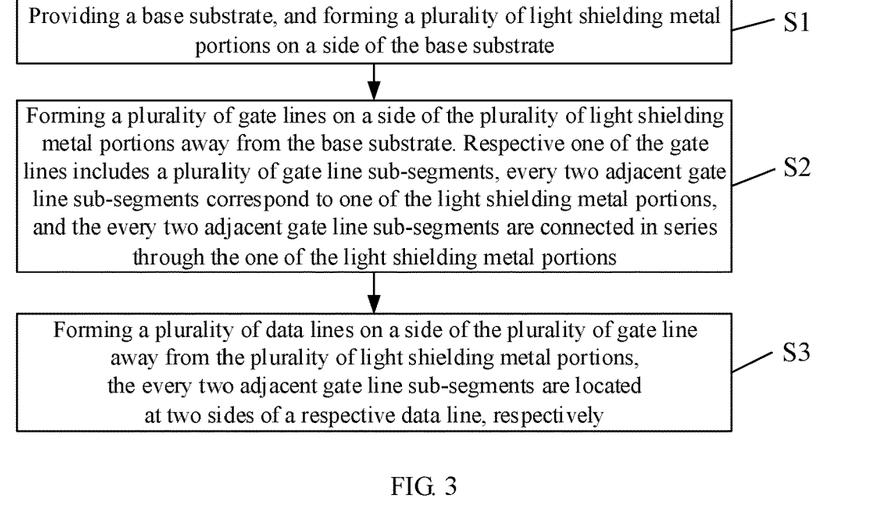
FIG. 3 is a flowchart of a manufacturing method of an array substrate provided by at least one embodiment of the present disclosure.
Figure 4:
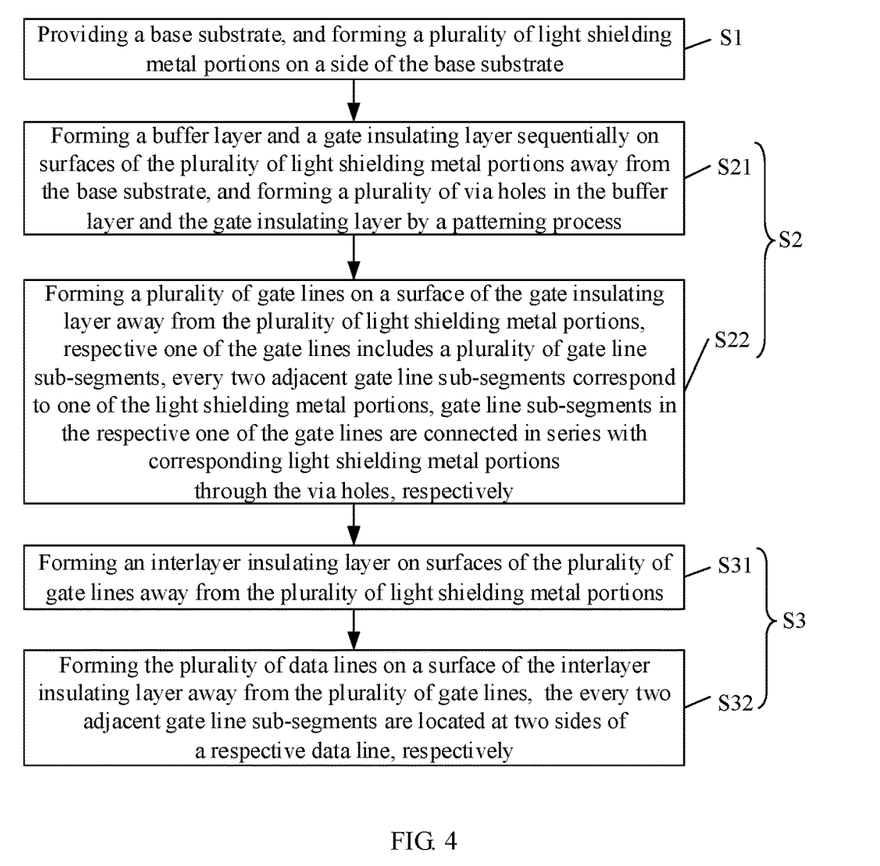
FIG. 4 is a flowchart of a specific implementation of the manufacturing method of the array substrate shown in FIG. 3.
Figure 5A:
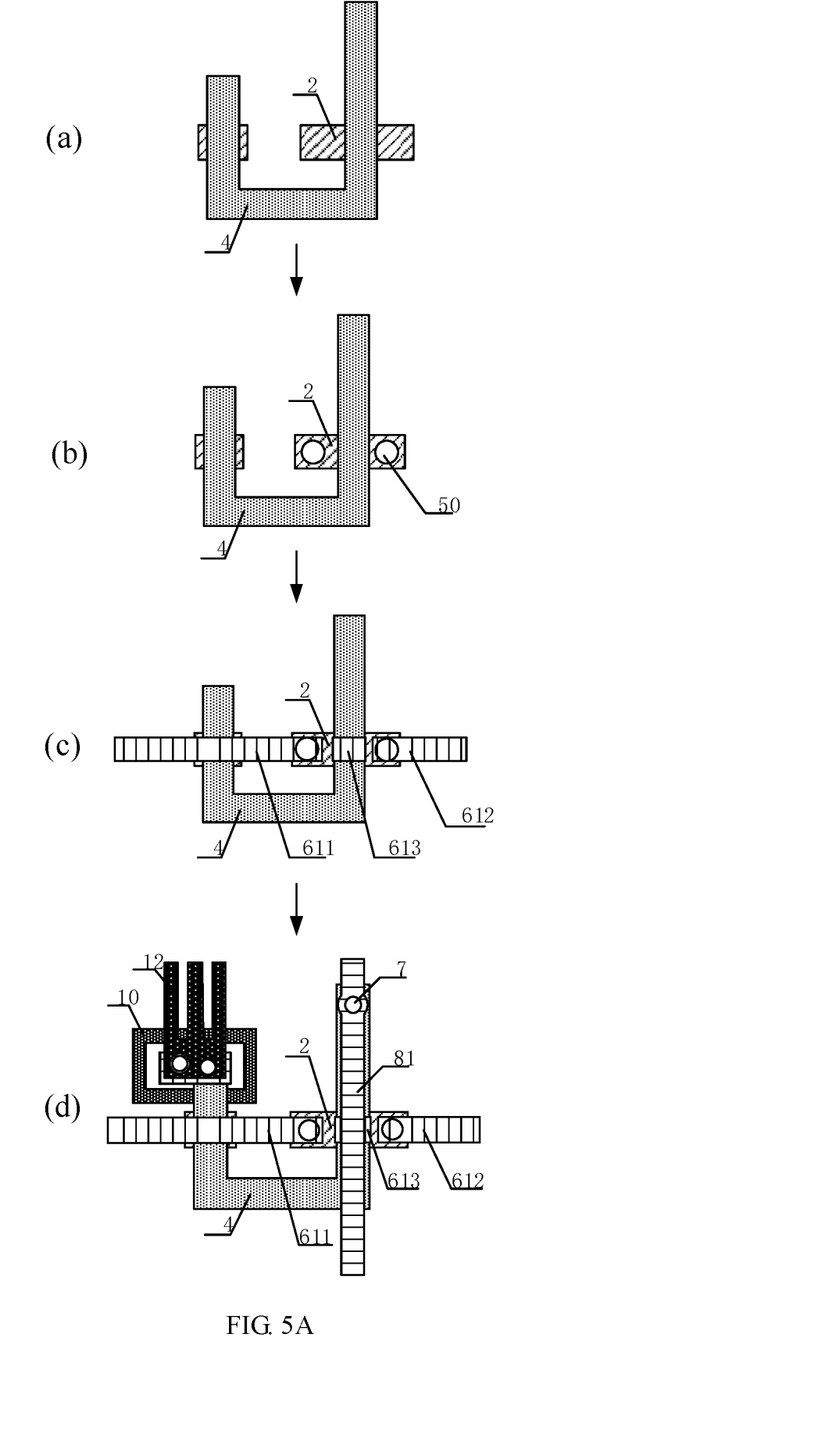
FIG. 5A is a schematic plan view illustrating a manufacturing process of the array substrate shown in FIG. 2A.
Figure 5B:
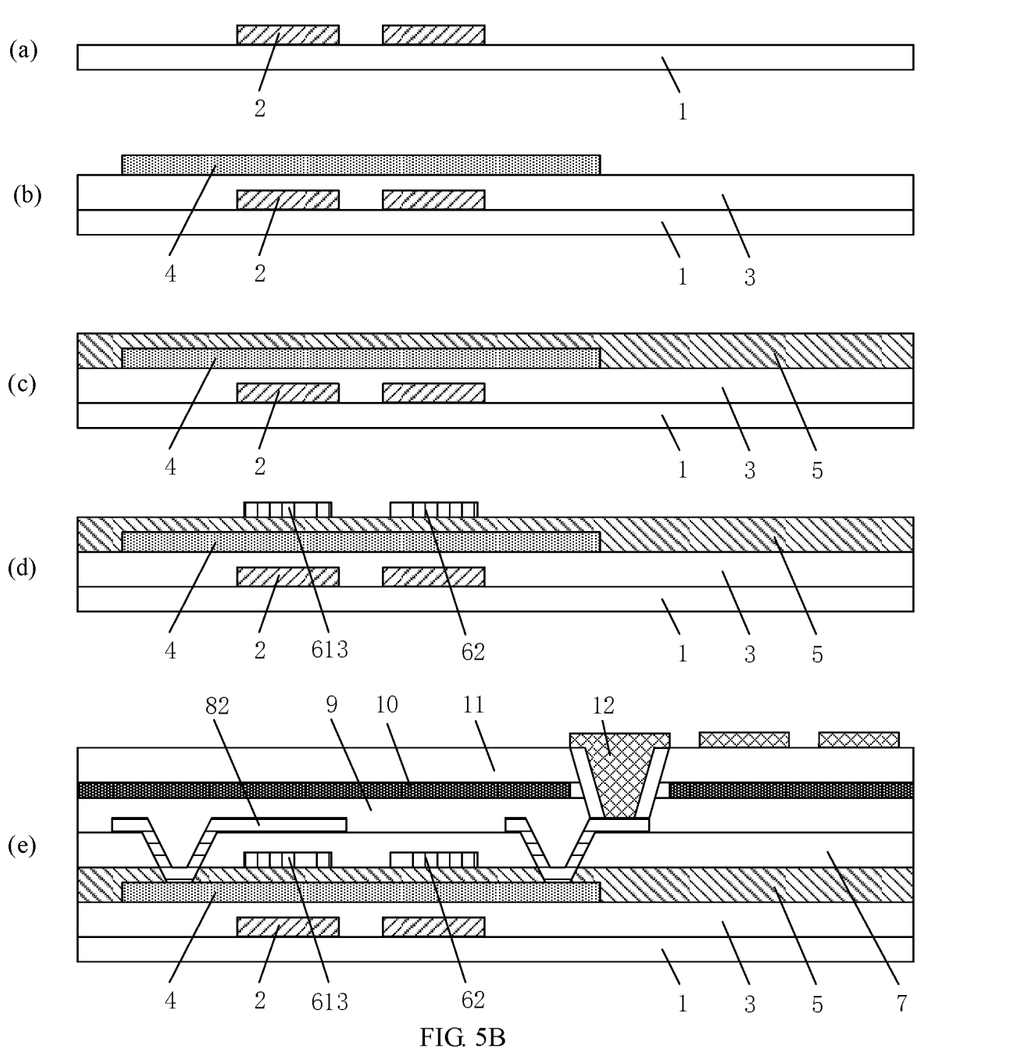
FIG. 5B is a schematic cross-sectional view illustrating a manufacturing process of the array substrate shown in FIG. 2A taken along line MN.
Figure 5C:
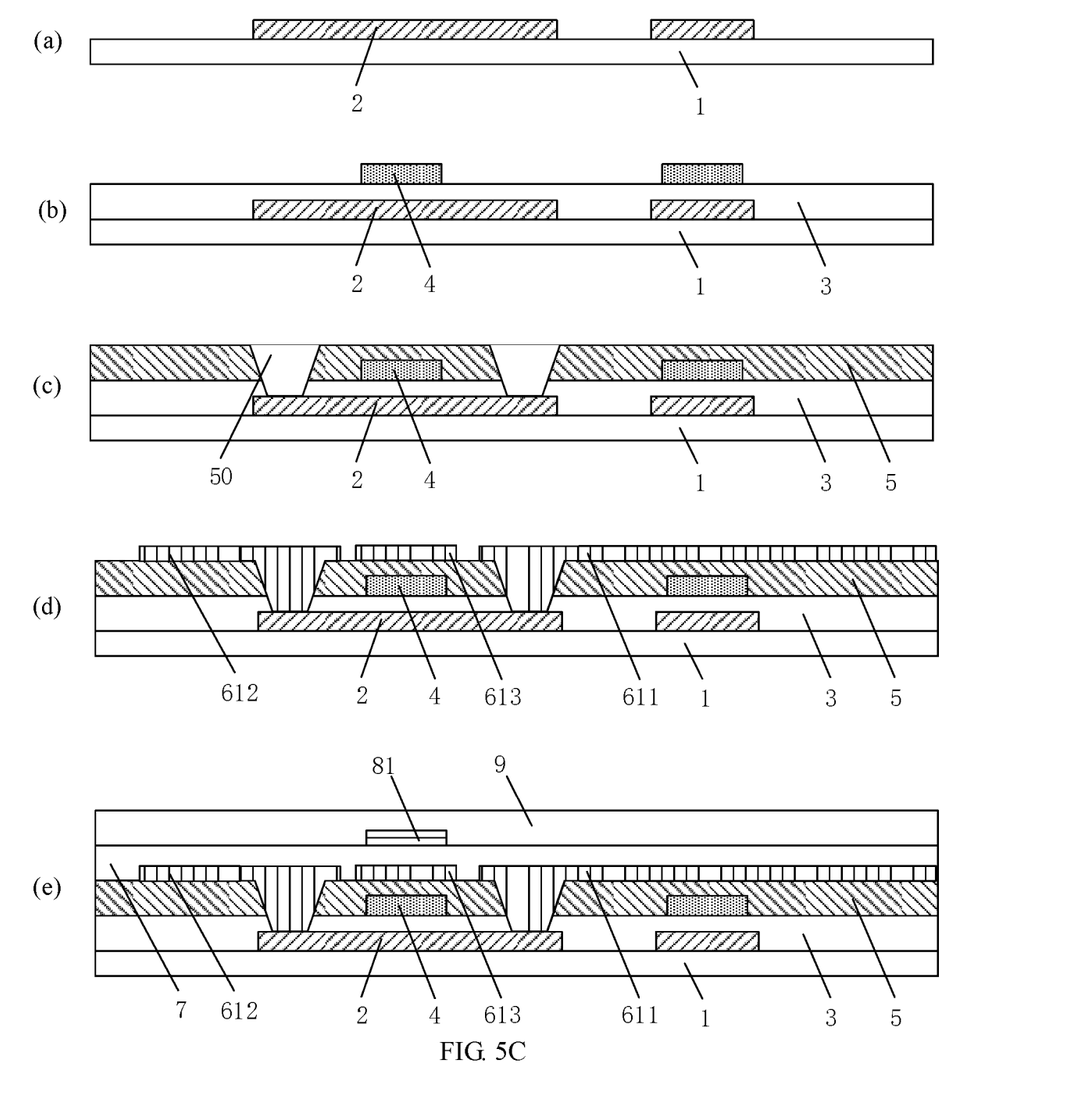
FIG. 5C is a schematic cross-sectional view illustrating a manufacturing process of the array substrate shown in FIG. 2A taken along line PQ.

At least one embodiment of the present disclosure further provides a manufacturing method of an array substrate, which is used for manufacturing the array substrate provided by any one of the above embodiments. FIG. 3 is a flowchart of a manufacturing method of an array substrate provided by at least one embodiment of the present disclosure, FIG. 4 is a flowchart of a specific implementation of the manufacturing method of the array substrate shown in FIG. 3, FIG. 5A is a schematic plan view illustrating a manufacturing process of the array substrate shown in FIG. 2A, FIG. 5B is a schematic cross-sectional view illustrating a manufacturing process of the array substrate shown in FIG. 2A taken along line MN, and FIG. 5C is a schematic cross-sectional view illustrating a manufacturing process of the array substrate shown in FIG. 2A taken along line PQ. Hereinafter, the manufacturing method of the array substrate shown in FIG. 3 and FIG. 4 will be described in detail with reference to FIG. 5A to FIG. 5C.

Referring to FIG. 3, the manufacturing method of the array substrate includes:

Step S1, providing a base substrate, and forming a plurality of light shielding metal portions on a side of the base substrate.

For example, a material of the base substrate includes but is not limited to glasses, etc.

For example, the light shielding metal portions are usually made of the same material as the gate line, and the material includes but is not limited to molybdenum (Mo) metal, titanium (Ti) metal, molybdenum alloy, titanium alloy, etc., and the number and forming positions of the light shielding metal portions can be set according to actual needs.

For example, referring to (a) in FIG. 5B and (a) in FIG. 5C, a plurality of light shielding metal portions 2 are formed on a side surface of the base substrate 1.

Step S2, forming a plurality of gate lines on a side of the plurality of light shielding metal portions away from the base substrate. Respective one of the gate lines includes a plurality of gate line sub-segments, every two adjacent gate line sub-segments correspond to one of the light shielding metal portions, and the every two adjacent gate line sub-segments are connected in series through the one of the light shielding metal portions.

For example, specifically, referring to FIG. 4, the step S2 may include step S21 and step S22.

Step S21, forming a buffer layer and a gate insulating layer sequentially on surfaces of the plurality of light shielding metal portions away from the base substrate, and forming a plurality of via holes in the buffer layer and the gate insulating layer by a patterning process.

For example, referring to (b) in FIG. 5B and (b) in FIG. 5C, a buffer layer 3 and an active layer 4 are sequentially formed on a surface of the base substrate 1 not covered by the light shielding metal portion 2 and on the surfaces of the light shielding metal portions 2 away from the base substrate 1. In this case, a schematic plan view of the array substrate is shown in (a) of FIG. 5A. Referring to (c) in FIG. 5B and (c) in FIG. 5C, a gate insulating layer 5 is formed on a surface of the buffer layer 3 not covered by the active layer 4 and on a surface of the active layer 4 away from the buffer layer 3, and the gate insulating layer 5 (and the buffer layer 3) is photo-etched to form via holes 50 penetrating to the light shielding metal portions 2. In this case, a schematic plan view of the array substrate is shown in (b) of FIG. 5A.

Step S22, forming a plurality of gate lines on a surface of the gate insulating layer away from the plurality of light shielding metal portions. Gate line sub-segments in the respective one of the gate lines are connected in series with corresponding light shielding metal portions through the via holes, respectively.

For example, referring to (d) in FIG. 5B and (d) in FIG. 5C, a gate line 61 is formed on a surface of the gate insulating layer 5 away from the active layer 4. For example, the gate lines 61 may be arranged in segments according to actual needs. For example, respective one of the gate lines 61 is manufactured into a first gate line sub-segment 611, a second gate line sub-segment 612, and a gate line floating segment 613. For example, the first gate line sub-segment 611 and the second gate line sub-segment 612 are connected in series with a light shielding metal portion 2 corresponding to a region B through via holes 50; the gate line floating segment 613 is insulated from the first gate line sub-segment 611 and the second gate line sub-segment 612, respectively, and the gate line floating segment 613 can be used to perform alignment shielding for the active layer 4 in the region B in a subsequent doping process. In this case, a schematic plan view of the array substrate is shown in (c) of FIG. 5A.

For example, in some examples, a gate electrode 62 is formed while forming the gate line 61, so that the gate electrode and the gate line are disposed in a same layer. For example, the gate electrode 62 may be a portion of the gate line 61, and the present disclosure includes but is not limited to this case.

Step S3, forming a plurality of data lines on a side of the plurality of gate line away from the plurality of light shielding metal portions. The every two adjacent gate line sub-segments are located at two sides of a respective data line, respectively.

For example, specifically, referring to FIG. 4, the step S3 may include step S31 and step S32.

Step S31, forming an interlayer insulating layer on surfaces of the plurality of gate lines away from the plurality of light shielding metal portions.

Step S32, forming the plurality of data lines on a surface of the interlayer insulating layer away from the plurality of gate lines.

For example, referring to (e) in FIG. 5B and (e) in FIG. 5C, an interlayer insulating layer 7 and data lines 81 are sequentially formed on surfaces of the gate lines 61 away from the gate insulating layer 5 and on a surface of the gate insulating layer 5 not covered by the gate lines 61. For example, further, a planarization layer 9, a common electrode layer 10, a passivation layer 11 and a pixel electrode layer 12, etc., may be sequentially formed on surfaces of the data lines 81 away from the interlayer insulating layer 7 and on a surface of the interlayer insulating layer 7 not covered by the data lines 81. In this case, a schematic plan view of the array substrate is shown in (d) of FIG. 5A.

For example, in some examples, a source-drain electrode 82 is formed while forming the data lines 81, so that the source-drain electrode and the data lines are disposed in a same layer. For example, the source-drain electrode 82 may be a portion of the data line 81, and the present disclosure includes but is not limited to this case.

It should be noted that, in order to clearly illustrate the structures such as the light shielding metal portion 2, the active layer 4, the gate line 61, the data line 81, etc., the structures of the base substrate 1, the buffer layer 3, the gate insulating layer 5, etc., are not shown in FIG. 5A. For clarity and conciseness, the structures such as the common electrode layer 10, the passivation layer 11 and the pixel electrode layer 12, etc., that are on the planarization layer 9 are not shown in (e) of FIG. 5C.

It should be noted that, in the array substrate shown in FIG. 2A and manufactured according to the manufacturing method of the array substrate described above, the gate lines are generally disposed in a different layer from the data lines, and the gate lines intersect with the data lines in a grid shape. The gate lines are generally formed in rows, and the data lines are generally formed in columns. A respective gate line is manufactured into a plurality of gate line sub-segments according to the distribution positions of the data lines; and every two adjacent gate line sub-segments are disconnected and are respectively located on two sides of a corresponding data line, that is, an orthographic projection of each gate line sub-segment on the base substrate is not covered by an orthographic projection of the corresponding data line on the base substrate, and each gate line sub-segment has no region directly facing the corresponding data line.

It should be noted that, in the array substrate shown in FIG. 2A and manufactured according to the manufacturing method of the array substrate described above, the light shielding metal portion 2 in the region B of the FIG. 2A may be selected to form a gate electrode (a bottom gate electrode), and therefore a doping process can be performed on the active layer 4 after the gate floating segment 613 is formed; alternatively, a gate electrode may not be formed in the region B (for example, a gate electrode is formed in the region A), so that a doping process can be performed at least on the active layer 4 in the region B before the gate floating segment 613 is formed. Of course, in the array substrate, a gate electrode may also be formed in the region A of FIG. 2A. For example, a portion of the gate line in the region A may be used as a gate electrode (a top gate electrode), so that a doping process can be performed on the active layer 4 after the gate line is formed; alternatively, a bottom gate electrode similar to the bottom gate electrode in the region B is formed in the region A by using the light shielding metal portion, and at the same time, another gate floating segment similar to the gate floating segment 613 in the region B is also formed, so as to perform alignment shielding in the subsequent doping process of the active layer 4. Of course, a gate electrode may not be formed in the region A (for example, a gate electrode is formed in the region B). For example, a portion of the gate line in the region A may be removed or may not be formed, and portions of the gate line on both sides of the region A are connected in series through the light shielding metal portion corresponding to the region A. Of course, gate electrodes may be formed simultaneously in the region A and in the region B, thereby forming a thin film transistor having a structure of double gate electrodes. It should be noted that the number and implementation manner of the gate electrode of each thin film transistor on the array substrate are not limited in the embodiments of the present disclosure.

Technical effects achieved by the manufacturing method of the array substrate provided by the embodiments of the present disclosure are the same as those achieved by the array substrate provided by the above-mentioned embodiments, and details are not described here again.

At least one embodiment of the present disclosure further provides a display device, which includes the array substrate provided by any one of the above embodiments. The array substrate in the display device has the same technical effects as the array substrate in the above embodiments, and details are not described here again.

For example, the display device provided by the above embodiment may be a product or a component having a display function, such as a mobile phone, a tablet computer, a notebook computer, a display, a television, a digital photo frame or a navigator, etc.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale.

(3) In case of no conflict, the embodiments of the present disclosure and the features in the embodiments can be combined with each other to obtain new embodiments.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An array substrate, comprising:
a base substrate;
a plurality of gate lines, disposed on a side of the base substrate;
a plurality of data lines, disposed on a side of the plurality of gate lines away from the base substrate and intersecting with the plurality of gate lines;
a plurality of light shielding metal portions, disposed between the base substrate and each of the plurality of gate lines, respectively,
wherein a respective one of the gate lines comprises a plurality of gate line sub-segments separated by the plurality of data lines, respectively, every two adjacent gate line sub-segments in the respective one of the gate lines are spaced apart from each other and correspond to one of the light shielding metal portions, and the every two adjacent gate line sub-segments in the respective one of the gate lines are connected in series through the one of the light shielding metal portions;
a plurality of gate line floating segments, disposed between the base substrate and each of the data lines;
a plurality of pixel units arranged in an array, wherein a respective one of the pixel units comprises a thin film transistor, and the thin film transistor is disposed on the base substrate;
wherein a respective gate line floating segment is disposed between the every two adjacent gate line sub-segments in the respective one of the gate lines, and is insulated from corresponding two gate line sub-segments in a same layer as the respective gate line floating segment;
the thin film transistor further comprises an active layer between a respective gate line and a respective light shielding metal portion, and insulated from the respective gate line and the respective light shielding metal portion, respectively; and
the active layer is U-shaped, and one branch of the active layer that is U-shaped intersects with the respective gate line floating segment.

2. The array substrate according to claim 1, wherein an orthographic projection of the respective one of the gate line sub-segments on the base substrate partially overlaps with an orthographic projection portion of a corresponding light shielding metal portion on the base substrate; and
an orthographic projection of a respective one of the light shielding metal portions on the base substrate intersects with an orthographic projection of a respective data line used to form corresponding gate line sub-segments by separation on the base substrate.

3. The array substrate according to claim 1, wherein a source-drain electrode of the thin film transistor is disposed in a same layer as the plurality of data lines; and gate electrodes of thin film transistors of pixel units in one row correspond to one of the plurality of gate lines.

4. The array substrate according to claim 1, wherein an orthographic projection of the active layer on the base substrate intersects with an orthographic projection of a respective gate line floating segment on the base substrate.

5. The array substrate according to claim 4, wherein the orthographic projection of the active layer on the base substrate partially overlaps with an orthographic projection of a respective data line used to form corresponding gate line sub-segments by separation on the base substrate.

6. The array substrate according to claim 1, wherein an orthographic projection of the active layer on the base substrate partially overlaps with an orthographic projection of a respective data line used to form corresponding gate line sub-segments by separation on the base substrate.

7. The array substrate according to claim 1, wherein the thin film transistor uses the one of the light shielding metal portions connecting the every two adjacent gate line sub-segments in the respective one of the gate lines as a gate electrode of the thin film transistor.

8. The array substrate according to claim 1, wherein another branch of the active layer that is U-shaped intersects with one of the every two adjacent gate line sub-segments in the respective one of the gate lines.

9. The array substrate according to claim 8, wherein a gate electrode of the thin film transistor is disposed in a same layer as the plurality of gate lines.

10. The array substrate according to claim 1, further comprising:
an interlayer insulating layer, disposed between the plurality of gate lines and the plurality of data lines.

11. The array substrate according to claim 1, further comprising:
at least one of a gate insulating layer and a buffer layer, and the at least one of the gate insulating layer and the buffer layer is disposed between a respective gate line sub-segment of the gate lines and a corresponding light shielding metal portion.

12. The array substrate according to claim 1, wherein a material for manufacturing the plurality of light shielding metal portions is same as a material for manufacturing the plurality of gate lines.

13. A display device, comprising the array substrate according to claim 1.

14. A manufacturing method of an array substrate, comprising:
providing a base substrate, and forming a plurality of light shielding metal portions on a side of the base substrate;
forming a plurality of gate lines on a side of the plurality of light shielding metal portions away from the base substrate, wherein a respective one of the gate lines comprises a plurality of gate line sub-segments, every two adjacent gate line sub-segments in the respective one of the gate lines correspond to one of the light shielding metal portions, and the every two adjacent gate line sub-segments in the respective one of the gate lines are spaced apart from each other and are connected in series through the one of the light shielding metal portions;
forming a plurality of data lines on a side of the plurality of gate lines away from the plurality of light shielding metal portions, wherein the every two adjacent gate line sub-segments are located at two sides of a respective data line, respectively;
forming a plurality of gate line floating segments between the base substrate and each of the data lines;
forming a plurality of pixel units arranged in an array, wherein a respective one of the pixel units comprises a thin film transistor, and the thin film transistor is disposed on the base substrate;
wherein a respective gate line floating segment is between the every two adjacent gate line sub-segments in the respective one of the gate lines, and is insulated from corresponding two gate line sub-segments in a same layer as the respective gate line floating segment;
the thin film transistor further comprises an active layer between a respective gate line and a respective light shielding metal portion, and insulated from the respective gate line and the respective light shielding metal portion, respectively; and
the active layer is U-shaped, and one branch of the active layer that is U-shaped intersects with the respective gate line floating segment.

15. The manufacturing method of the array substrate according to claim 14, wherein the forming the plurality of gate lines on a side of the plurality of light shielding metal portions away from the base substrate, comprises:
forming a buffer layer and a gate insulating layer sequentially on surfaces of the plurality of light shielding metal portions away from the base substrate, and forming a plurality of via holes in the buffer layer and the gate insulating layer by a patterning process; and
forming the plurality of gate lines on a surface of the gate insulating layer away from the plurality of light shielding metal portions, gate line sub-segments in the respective one of the gate lines being connected in series with corresponding light shielding metal portions through the via holes, respectively.

16. The manufacturing method of the array substrate according to claim 14, wherein the forming the plurality of data lines on a side of the plurality of gate lines away from the plurality of light shielding metal portions, comprises:
forming an interlayer insulating layer on surfaces of the plurality of gate lines away from the plurality of light shielding metal portions; and
forming the plurality of data lines on a surface of the interlayer insulating layer away from the plurality of gate lines.

* * * * *